US006541780B1

(12) United States Patent
Richards et al.

(10) Patent No.: US 6,541,780 B1
(45) Date of Patent: Apr. 1, 2003

(54) PARTICLE BEAM CURRENT MONITORING TECHNIQUE

(75) Inventors: Steven L. F. Richards, Georgetown, MA (US); Nobuhiro Tokoro, West Newbury, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 09/123,635

(22) Filed: Jul. 28, 1998

(51) Int. Cl.[7] .......................... G21G 5/00; G21K 5/21; H01J 49/00
(52) U.S. Cl. .................. 250/492.2; 250/492.2; 250/296; 250/492.3
(58) Field of Search .................. 250/397, 492.2, 250/310, 311, 492.21, 492.3, 296

(56) References Cited

U.S. PATENT DOCUMENTS

| | | | |
|---|---|---|---|
| 4,357,536 A | | 11/1982 | Varma et al. ............... 250/397 |
| 4,539,217 A | * | 9/1985 | Farley ......................... 427/10 |
| 4,587,433 A | * | 5/1986 | Farley ..................... 250/492.2 |
| 4,847,504 A | * | 7/1989 | Aitken ................... 250/492.2 |
| 5,166,518 A | * | 11/1992 | Freedman ................... 250/296 |
| 5,376,787 A | * | 12/1994 | Smith ........................ 250/281 |
| 5,451,794 A | * | 9/1995 | McKeown et al. ...... 250/492.3 |
| 5,693,939 A | * | 12/1997 | Purser ........................ 250/251 |
| 5,719,403 A | * | 2/1998 | Purser ........................ 250/251 |
| 5,834,787 A | * | 11/1998 | Bunker .................. 250/492.21 |
| 5,909,031 A | * | 6/1999 | Kellerman ............. 250/492.21 |
| 5,998,798 A | * | 12/1999 | Halling et al. ......... 250/492.21 |
| 6,130,436 A | * | 10/2000 | Renau et al. ............... 250/281 |

OTHER PUBLICATIONS

Reul B. Liebert, Shu Satoh, Adrian Delforge & Edward Evans; Dose Control System for the Extrion 1000 Ion Implantation System; Nuclear Instruments and Methods in Physics Research B37/38 (1989) pp. 464–468; North–Holland, Amsterdam.
G. Ryding and M. Farley; A New Dose Control Technique for Ion Implantation; Nuclear Instruments and Methods 189 (1981) pp. 295–303; North–Holland Publishing Company.
D.W. Berrian, R.E. Kaim and J. W. Vanderpot; In Situ Uniformity Control, Dose Monitoring and Correction; Nuclear Instruments and Methods in Physics Research B37/38 (1989) pp. 518–520; North–Holland, Amsterdam.
Hans Glawischnig, John O'Connor, Frank Sinclair, Mike Harris and Michael Current; Modern Implanter Concepts; pp. 391–463; J. Ziegler, editor; Ion Implantation Science and Technology (1996) chapter 7; Ion Implant Technology Company.

* cited by examiner

Primary Examiner—John R. Lee
Assistant Examiner—Kalimah Fernandez
(74) Attorney, Agent, or Firm—Wolf, Greenfield & Sacks, P.C.

(57) ABSTRACT

A method of monitoring particle beam current in an ion implanter in which the ion beam is analyzed to separate it into a separate sub-beam for each ion charge state. At least one sub-beam, having a charge state different from the desired charge state, is intercepted, and the current of the intercepted sub-beam is measured. This current is useful as an estimate of the current of the desired sub-beam which is used for the implantation.

16 Claims, 6 Drawing Sheets

PARTICLE BEAM CURRENT MONITORING TECHNIQUE

BACKGROUND OF THE INVENTION

1. Field of the Invention

The present invention relates to implantation of ions into silicon wafers and to the measurement of ion dose during an ion implantation process.

2. Description of the Related Art

In a conventional ion implanter dose control system, the main ion beam is sampled either periodically or continuously during wafer implantation to provide a measure of the ion particle current (particles/sec.).

The ion beam produced by an ion implanter is subject to both long and short term variations in intensity. Since the beam is generally much smaller than the wafer target, providing a spatially uniform dose on the wafer requires that either the beam is translated across the wafer or that the wafer is translated through the beam. It is common practice to modulate the translational velocity by a factor derived from the beam particle current to compensate for variations in beam current during an implant.

Before the translational velocity correction can be determined, the main (or implant) beam current must be known. There are many ways of satisfying this requirement. Two of the commonest are:

1) Multiplexing the beam (either spatially or temporally) to provide a sample of its intensity during the implant.
2) Collecting and measuring the current striking the wafer directly.

Both of these techniques suffer from the disadvantage that they measure the beam current in the proximity of the wafer. The wafer may induce local environmental perturbations which adversely affect the accuracy of the beam current measurement, resulting in dose errors. For example, if the wafer outgasses under the impact of the beam, the resultant vacuum degradation will cause undesired charge exchange of the beam, leading to an error in the beam current measurement.

SUMMARY OF THE INVENTION

The invention provides a novel means of measuring and ensuring that silicon wafers receive the correct ion dose (particles/cm$^2$) during an ion implantation process.

In a conventional ion implanter dose control system, the main ion beam is sampled periodically during wafer implantation to provide an estimate of the ion particle current (particles/sec.).

In the present invention, the particle current of the main ion beam is estimated by measuring the ion current of an alternate (unused, mass resolved) ion beam which possesses a charge state which is undesirable for wafer implantation. Since the alternate (or monitor) beam is not used for wafer implantation, it can be monitored continuously and in a region of stable vacuum quality where ion currents can be measured most accurately. The ion current in the monitor beam is proportional to the ion current in the main beam and their ratio can be measured between wafer implantation batches. Therefore, by measuring the ion current of the monitor beam, the ion current of the main beam can be inferred. This method provides greater accuracy, especially in the presence of hydrogen outgassing from photoresist coated wafers, since the measurement is performed upstream from the poor vacuum of the wafer process chamber.

BRIEF DESCRIPTION OF THE DRAWINGS

The invention may best be understood from the following detailed description thereof, having reference to the accompanying drawings, in which.

DETAILED DESCRIPTION

Figure 1:
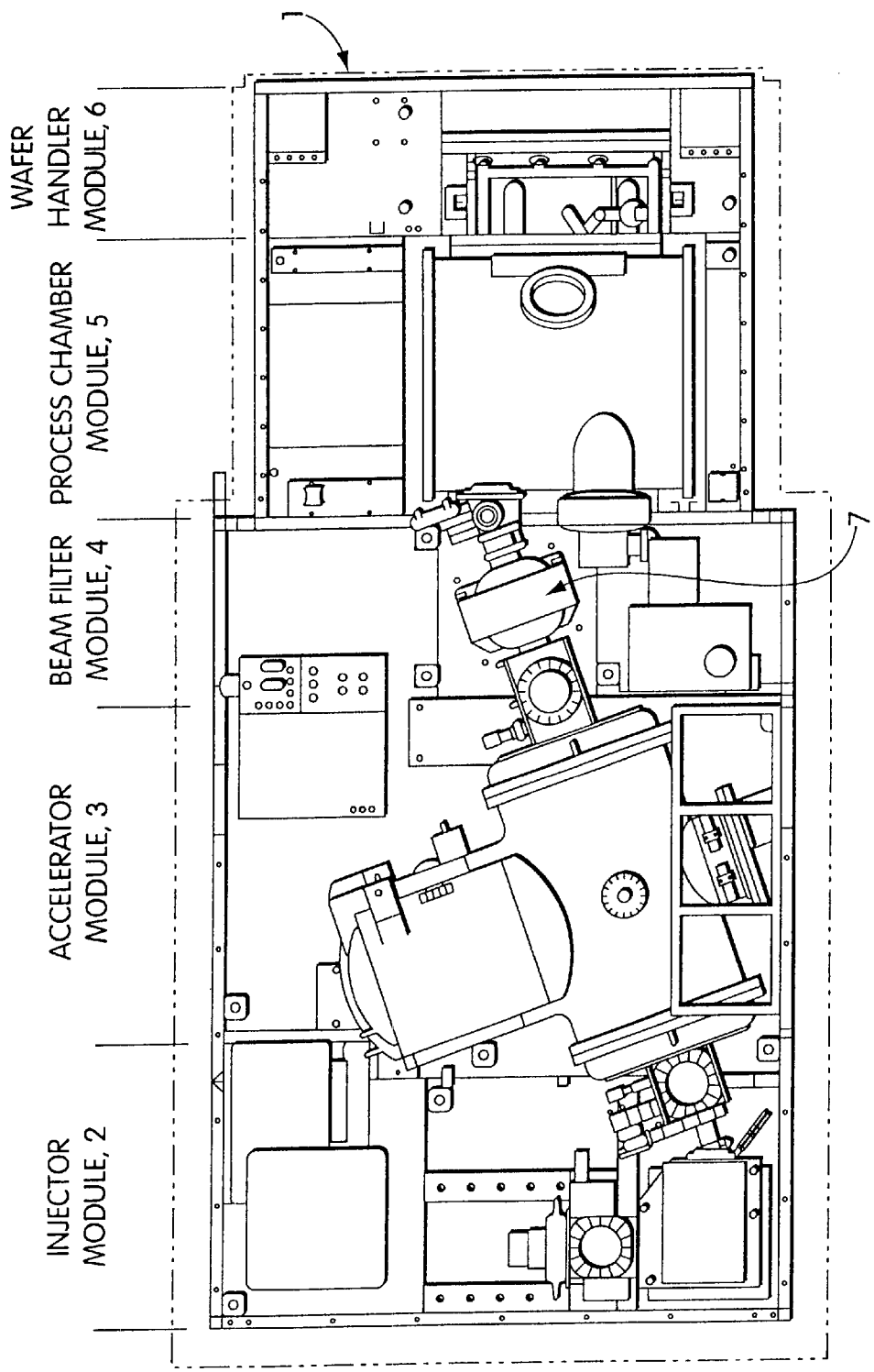
FIG. 1 is a top view of an ion implanter.

Referring to the drawings, and first to FIG. 1 thereof, therein is shown an overall plan view of an ion implanter 1 suitable for use with the invention. Although the invention is applicable to ion implanters generally without limiting the invention, one suitable implanter might be, for example, the MeV Ion Implanter System manufactured by Genus, Inc., Ion Technology Division, 4 Stanley Tucker Drive, Newburyport, Mass. as its model G1520 under the trademark "Tandetron". The G1520 is typically used to implant boron, phosphorous or arsenic in the energy range 25 KeV–2.65 MeV into silicon wafers. Typical values of particle current range from $1 \times 10^{11}$ to $1 \times 10^{16}$ particles/sec. Typical dose values range from $5 \times 10^{10}$ to $1 \times 10^{16}$ particles/square cm. Depending on the energy of the implant, the ions striking the wafer may be singly, doubly or triply charged. When performing an 800 keV singly charged phosphorous implant, the G1520 uses a 10° magnet operating at 4667 gauss to select the desired charge state.

The system shown in FIG. 1 is divided into five major modules: the injector 2, the tandem acceleration region 3, the beam filter module 4, the process chamber module 5, and the wafer handling module 6. The present invention is located in the beam filter region 4, which includes a 10° uniform field magnet 7, a drift region, and the final charge state selection aperture. This unit selects the desired ion beam by separation of the charge states (1+, 2+, 3+ and 4+) formed in the center of the accelerator module 3. No mass analysis is performed at this stage, only energy analysis by selection of different charge states of the same species. The positive ion beam currents are optimized in a setup Faraday cup prior to entry into the process chamber 5.

Figure 2:
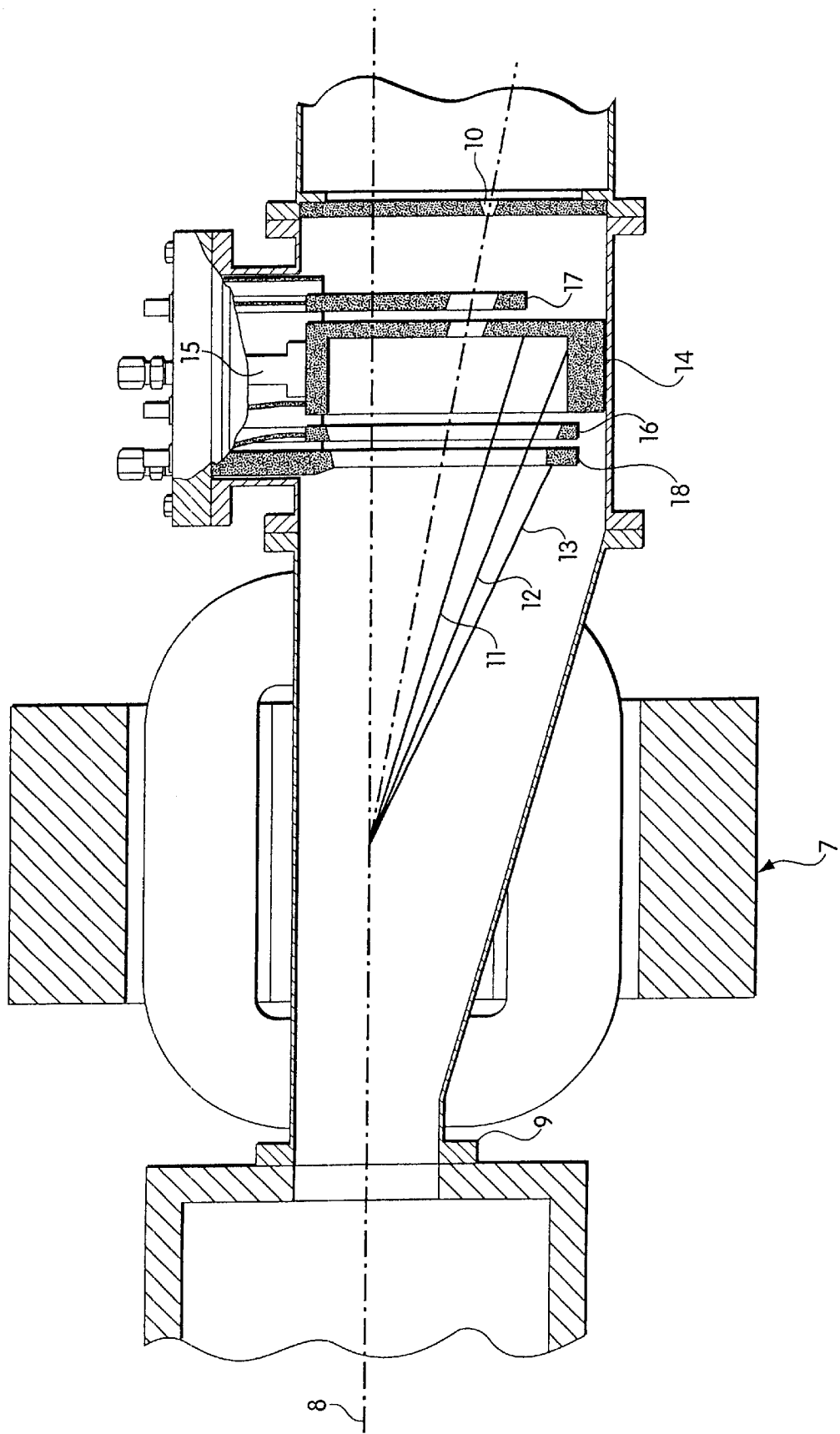
FIG. 2 is a top view, partly in section, of a portion of the ion implanter of FIG. 1 which embodies the present invention.

The beam filter module 4 is shown in greater detail in FIG. 2. The ion beam from the accelerator module 3 enters the beam filter module 4 along the accelerated ion beam axis 8 at the vacuum waveguide entrance 9. Passing through the magnetic field produced by the 10° analyzer magnet 7, the ion beam is split into separate beams for each of the charge states contained in the main beam. A filter slit 10 in the path of the accelerated ion beam is so positioned in relation to the magnetic field strength that the desired charge state is selected. In the example of FIG. 2, the selected charge state is charge state (1). The other charge states follow different trajectories 11,12,13, while the neutral beam remains along beam axis 8. In accordance with the present invention, a Faraday cup 14 is located to read the current of one or more of the unselected charge states. In the example of FIG. 2, the unselected charge states which are read are charge states 2, and 3.

The Faraday cup 14 is supported by an insulator 15 which also serves to conduct cooling water to and from the cup. The cup is surrounded by front 16 and rear 17 bias electrodes, which are maintained at a negative potential. The bias electrodes ensure that no externally generated electrons reach the cup, and also that any electrons generated in the cup do not escape, but are returned to the cup. The acceptance area of the assembly is defined by a water cooled grounded aperture 18.

Figure 3:
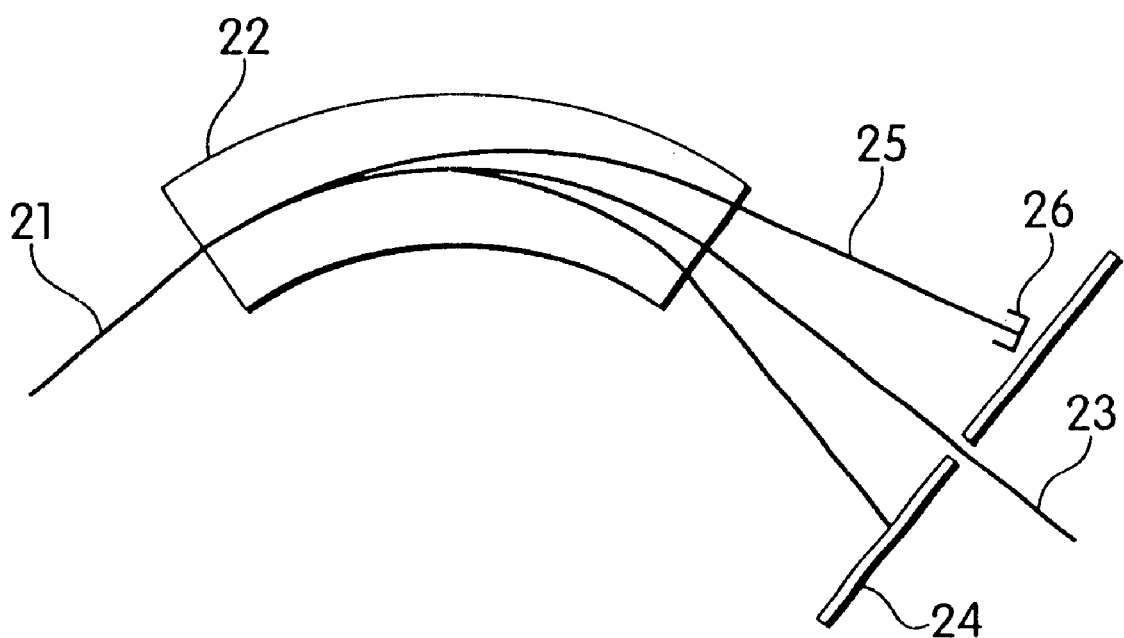
FIG. 3 is a diagrammatic view of the path of a multicomponent ion beam through a magnetic field.

The action of the magnetic field of FIG. 2 may be understood with reference to FIG. 3. Referring thereto, when an ion beam 21 passes through a magnetic field 22, the various constituent ions experience angular deflections determined by their mass, velocity and charge. This technique is commonly used to filter ions of a particular mass/velocity/charge combination from a multicomponent beam. The different angular deflections result in the various components of the beam being separated spatially. An "analyzing slit" 24 is positioned to pass only the desired main beam 23; alternate, unwanted components 25 experience different angular deflections and do not pass through the analyzing slit 24 and do not contribute to the implantation of the wafer.

During the time of an implant, the intensity of one or more of these alternate, unwanted components 25 is proportional to the intensity of the desired main beam 23. For example, if the input to a tandem accelerator is composed of ions of a single mass, velocity and charge state, the output beam will contain ions of a single mass but a variety of velocities and charges. The physics of the acceleration process allow the relative proportions of the various components of the output beam to be constant over a wide range of output beam intensity.

Thus the intensity of the main beam 23 may be monitored by measuring the intensity of one or more of the alternate, unwanted component beams 25, at any convenient point downstream of the 10° magnet. It may be found convenient to measure the unwanted component's intensity in the vicinity of the analyzing slit, making use of the pre-existing spatial separation of the beam components in this area; however, other implementations are possible without departing from the spirit and scope of the present invention. The intensity of the unwanted component is preferably measured at a location 26 well separated from the point of beam impact on the wafer; thus environmental perturbations caused by beam/wafer interaction will have minimal effect on the beam intensity measurement.

To permit an absolute measurement of the main beam current, it is determine the ratio of the main beam current to the monitor beam current to the monitor beam current. This determination can be made by measuring both currents at a convenient time when the main beam is not performing an implant.

Figure 4:
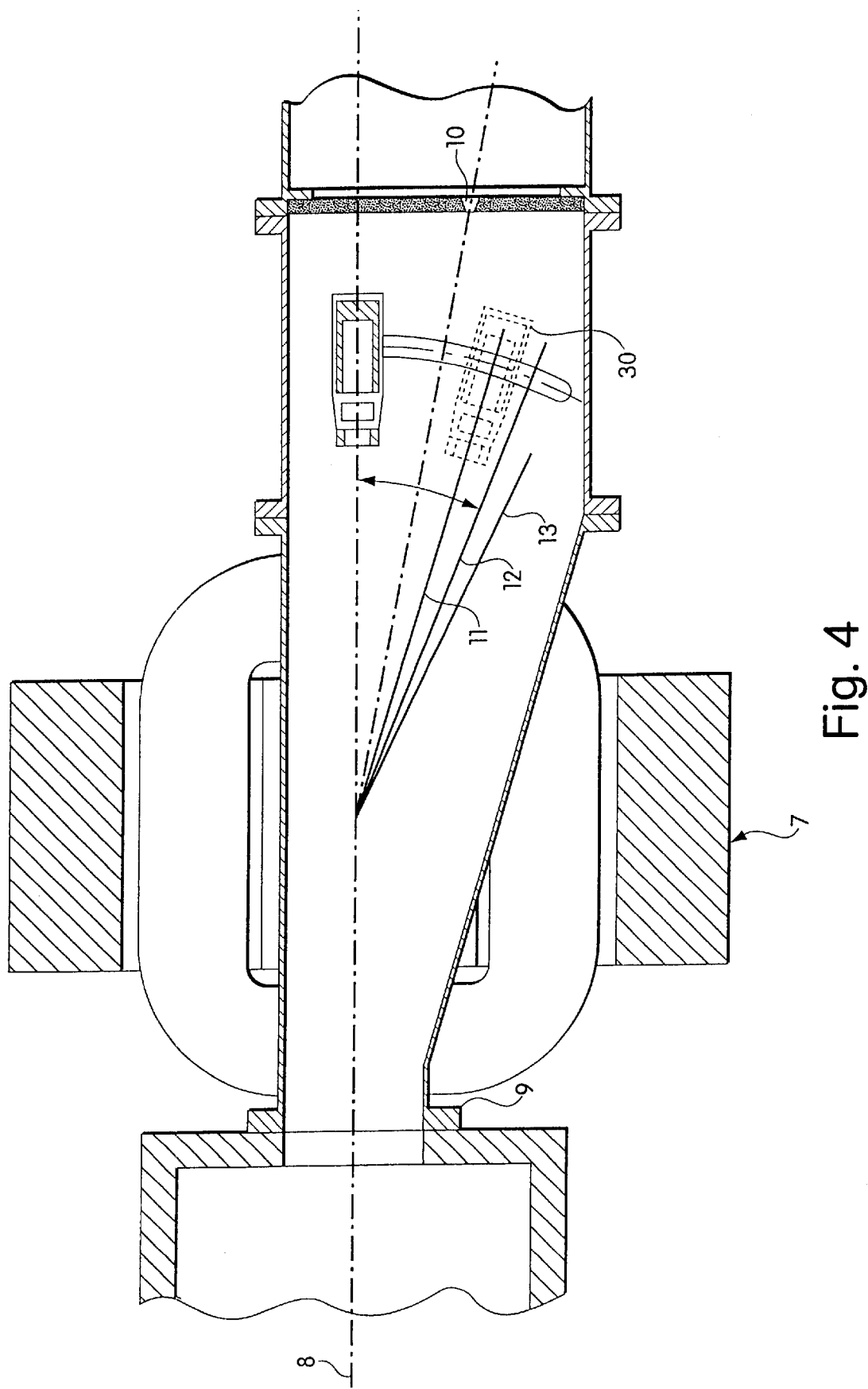
FIG. 4 is an alternative embodiment of the invention which uses a smaller, moveable Faraday cup.

There are a number of alternative embodiments of the invention which may be preferred under specific circumstances. FIG. 4 illustrates an arrangement in which the single fixed Faraday cup is replaced by a smaller, moveable cup 30. The smaller cup may be positioned to monitor a single unselected charge state (or possibly more than one at a time), thus rejecting the other unselected beams. This may be desirable if the intensity of one of the unselected beams is not proportional to the intensity of the selected beam. Under these circumstances it will be necessary to reject the unselected beam to obtain a reliable measure of the beam current.

Figure 5:
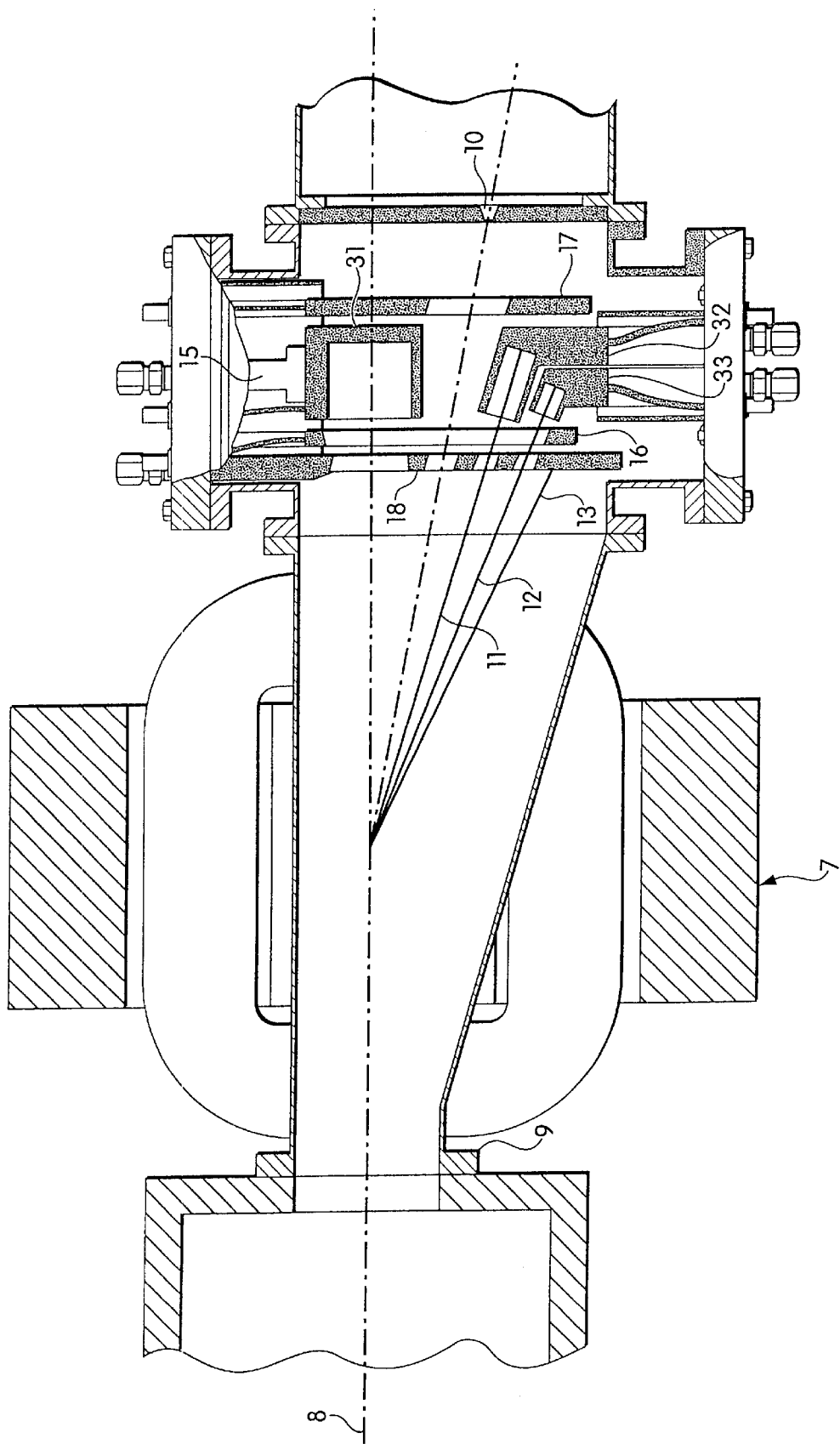
FIG. 5 is an alternative embodiment of the invention which uses a multiplicity of smaller, fixed Faraday cups.

Another embodiment is shown in FIG. 5, in which the single fixed Faraday cup has been replaced by a plurality of smaller, fixed cups 31,32,33, positioned to intercept the beams generated by specific unselected charge states. If the charge state 1 beam is selected (i.e. is being passed by the analyzing slit 10), Faraday cup 31 will intercept the neutral (charge state 0) beam, Faraday cup 32 will intercept the charge state 2 beam, and Faraday cup 33 will intercept the charge state 3 beam. If the field generated by the magnet 7 is reduced, a higher charge state beam will be selected, in which case Faraday cup 31 will collect beams with a charge state lower then the charge state of the selected beam. For example, if charge state 3 is passing through the analyzer slit 10, charge states 1 and 2 will be collected by Faraday cup 31.

Figure 6:
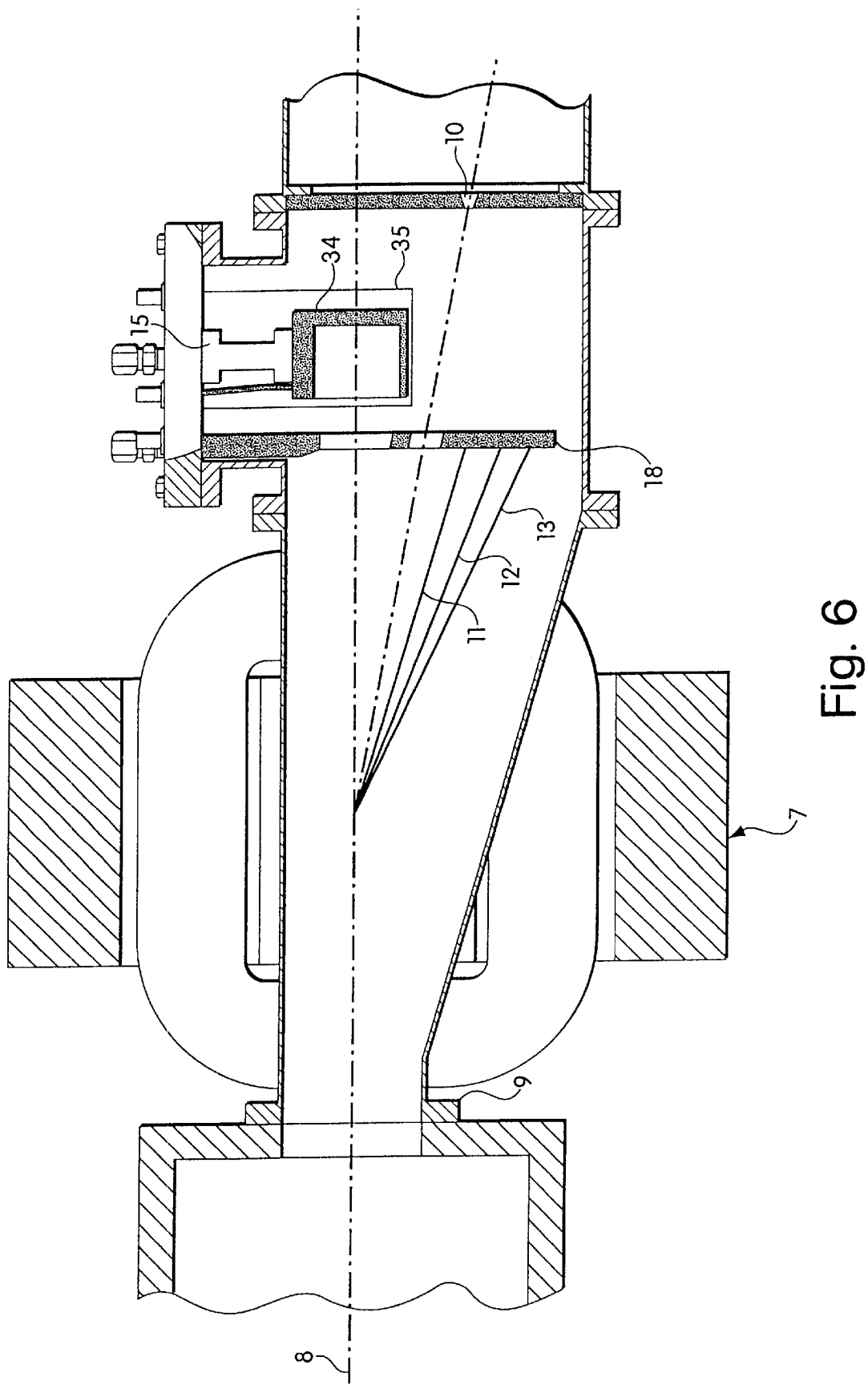
FIG. 6 is an alternative embodiment of the invention which uses a single cup to monitor the intensity of the neutral beam.

Another embodiment is shown in FIG. 6. Collector 34 is positioned to intercept the neutral (charge state 0) beam, which is always passed undeviated by the magnetic field. The impact of the beam will stimulate the emission of secondary electrons from the collector. Some of these electrons will escape, causing a current to flow in an ammeter connected to the collector; the magnitude of the current will provide an estimate of the intensity of the neutral beam. Ground shield 35 surrounds the collector, shielding it from other charged particles that may be present. In this embodiment, unselected charge state beams 11–13 impact grounded aperture 18.

Having thus described the principles of the invention, together with several illustrative embodiments thereof, it is to be understood that, although specific terms are employed, they are used in a generic and descriptive sense, and not for purposes of limitation, the scope of the invention being set forth in the following claims.

We claim:

1. A method of determining a current of an ion beam directed at a target during an ion implantation process, the method comprising acts of:

generating an ion beam;

separating the ion beam by energy analysis to select different charge states of a same species of ions to provide a sub-beam of ions having a desired charge state, which constitutes an implantation ion beam, and a sub-beam of ions having an undesired charge state;

directing the implantation ion beam onto the target to effect the ion implantation process;

intercepting the sub-beam of ions having the undesired charge state to provide an intercepted sub-beam;

measuring a current of the intercepted sub-beam to provide a measured current;

determining an absolute value of a current of the implantation ion beam based on the measured current and on a known relationship between the current of the intercepted sub-beam and the current of the implantation ion beam.

2. The method of claim 1, wherein the ion beam comprises ions selected from a group of species consisting of boron, phosphorus and arsenic.

3. The method of claim 1, wherein there are a plurality of sub-beams of ions having an undesired charge state, and in which intercepting the sub-beam includes intercepting all of said sub-beams.

4. The method of claim 1, which the charge state of the intercepted sub-beam of ions is zero.

5. The method of claim 4 in which measuring the current of the intercepted sub-beam of ions includes measuring a current of secondary electrons emitted as a result of the act of intercepting the sub-beam.

6. An apparatus that determines a current of an ion beam directed at a target during an ion implantation process, comprising:

an ion beam generator that provides a beam of ions;

a separating device that separates the beam of ions by energy analysis to select different charge states of a same species of ions to provide a sub-beam of ions having a desired charge state, which constitutes an implantation ion beam, and a sub-beam of ions having an undesired charge state;

a measuring device that measures a current of the sub-beam of ions having the undesired charge state, to provide a measured current; and a device, coupled to the measuring device, that determines an absolute value of a current of the implantation ion beam based on the measured current and on a known relationship between the current of the implantation ion beam and the measured current.

7. The apparatus of claim 1, wherein the measuring device includes at least one Faraday cup.

8. The apparatus of claim 6 wherein the measuring device includes a single Faraday cup.

9. The apparatus of claim 8 in which said single Faraday cup is fixed.

10. The apparatus of claim 9 in which said single Faraday cup intercepts the sub-beam of ions having the undesired charge state, to provide an intercepted beam.

11. The apparatus of claim 10 in which the charge state of the intercepted beam is zero.

12. The apparatus of claim 11 in which said measuring device includes means for measuring a current of secondary electrons emitted as a result of intercepting the sub-beam of ions.

13. The apparatus of claim 7 in which the measuring device includes a plurality of Faraday cups, each said Faraday cup intercepting a single sub-beam of ions having an undesired charge state.

14. The apparatus of claim 7 further including at least one bias electrode maintained at a negative potential and located proximate said Faraday cup, to prevent externally generated electrons from reaching said Faraday cup, and to maintain in the cup electrons generated in the cup.

15. The apparatus of claim 7 further including means for circulating cooling liquid through each said Faraday cup.

16. The apparatus of claim 8 in which said single Faraday cup is movable, to intercept different sub-beams.

* * * * *

UNITED STATES PATENT AND TRADEMARK OFFICE
CERTIFICATE OF CORRECTION

PATENT NO. : 6,541,780 B1
DATED : April 1, 2003
INVENTOR(S) : Richards et al.

It is certified that error appears in the above-identified patent and that said Letters Patent is hereby corrected as shown below:

Column 4,
Line 62, insert the word -- in -- before the word "which".

Column 5,
Line 19, "claim 1" should read -- claim 6 --.

Signed and Sealed this

Twenty-ninth Day of July, 2003

JAMES E. ROGAN
*Director of the United States Patent and Trademark Office*